United States Patent [19]
Liu

[11] Patent Number: 5,686,338
[45] Date of Patent: Nov. 11, 1997

[54] PROCESS FOR FABRICATING HIGH-RESISTANCE LOAD RESISTORS USING DUMMY POLYSILICON IN FOUR-TRANSISTOR SRAM DEVICES

[75] Inventor: Ming-Hsi Liu, Chungli, Taiwan

[73] Assignee: Winbond Electronics Corporation, Hsinchu, Taiwan

[21] Appl. No.: 686,587

[22] Filed: Jul. 26, 1996

[30] Foreign Application Priority Data

Jun. 1, 1996 [TW] Taiwan ................................ 85106541

[51] Int. Cl.⁶ .............................................. H01L 21/8244
[52] U.S. Cl. ............................ 437/52; 437/60; 437/918; 148/DIG. 136
[58] Field of Search ........................... 437/52, 60, 918; 148/DIG. 136; 257/904

[56] References Cited

U.S. PATENT DOCUMENTS 4,965,214  10/1990  Choi et al. ............................ 437/60
5,025,741   6/1991  Suwanai et al. ...................... 437/52
5,187,114   2/1993  Chan et al. ........................... 437/52

*Primary Examiner*—Jey Tsai
*Attorney, Agent, or Firm*—Rabin, Champagne & Lynt, P.C.

[57] ABSTRACT

A process for fabricating load resistors for memory cell units of a semiconductor SRAM device. The process includes providing a silicon substrate containing an intermediate semiconductor device having a gate structure and source/drain regions for a transistor of the cell unit. A first dielectric layer is then formed over the surface of the silicon substrate, wherein the first dielectric layer has an opening via exposing the gate electrode of the gate structure. A polysilicon layer is then deposited and patterned for forming a first connector in the via, at least one dummy structure on the first dielectric layer, and a second connector. A second dielectric layer is then formed to have two further vias respectively exposing the first and second connectors. A polysilicon load resistor is formed and coupled electrically to the first and second connectors and extends over the surface of the at least one dummy structure so as to have an elongated length.

7 Claims, 15 Drawing Sheets

PROCESS FOR FABRICATING HIGH-RESISTANCE LOAD RESISTORS USING DUMMY POLYSILICON IN FOUR-TRANSISTOR SRAM DEVICES

BACKGROUND OF THE INVENTION

1. Field of the Invention

The invention relates in general to a process for fabricating semiconductor integrated circuit (IC) devices. In particular, the invention is directed to a process for fabricating load resistors, for static random access memory (SRAM) semiconductor IC devices, that are formed as elongated load resistors to increase the resistance.

2. Description of the Related Art

An SRAM is a widely utilized semiconductor IC memory device having special importance in applications to the digital electronic information industry. Measures for increasing device integration density by reducing IC device size, while maintaining good device quality, have long been goals in the making of this category of semiconductor memory IC device. Load resistors are components of the memory cells of typical SRAM devices. SRAM memory cell load resistors are normally sections of polysilicon that are undoped, or lightly doped with impurity ions.

A conventional SRAM IC device includes a matrix of typical memory cell units, such as the SRAM memory cell shown in FIG. 1. The memory cell of FIG. 1 has a pair of load resistors $R_1$ and $R_2$, a pair of pull-down transistors $Q_1$ and $Q_2$, and a pair of pass transistors $Q_3$ and $Q_4$. All four memory cell transistors employ the same first polysilicon layer in the device to form their transistor gate electrodes. High-resistance sections of a second polysilicon layer are used as the necessary load resistors for the memory cells. Other sections of the second polysilicon layer, having lower resistance, are used as the interconnectors, which are also necessary for the fabricated device.

Prior art techniques have thus been utilizing the same layer of polysilicon in the device to form both load resistors and interconnectors. Those sections to be made into load resistors are either lightly doped or not doped at all. Those sections to be made into interconnectors, on the other hand, are heavily doped. Interconnectors and load resistors together form the electrical path leading from power supply source $V_{CC}$ to the nodes A and B shown in FIG. 1. Since the same polysilicon layer (polysilicon 2) is used for the formation of both the interconnectors and the load resistors, the interconnectors and load resistors will therefore have substantially the same thickness.

In order to explain the process for the fabrication of the load resistors for these conventional SRAM devices, an example is briefly described below.

FIGS. 2A–2J are respective cross-sectional views of a sequence of process stages during fabrication of load resistors of a conventional SRAM device.

First, as is shown in the intermediate semiconductor device of FIG. 2A, a silicon substrate 10 is provided as a base, with a gate electrode 12 for the gate structure and a pair of source/drain regions 14 and 16 of a transistor, thereon. Then, an inter-polysilicon dielectric layer 18 is formed on the surface of the substrate, covering the transistor. Referring to FIG. 2B, a photoresist layer 20, having openings exposing the dielectric layer in locations corresponding to the gate 12 and one source/drain region 14, is formed. As shown in FIG. 2C, this is followed by etching to remove the exposed portions of the dielectric layer 18. This results in the formation of vias in the dielectric layer 18 above the gate electrode 12 and the source/drain region 14.

Then, as is shown in FIG. 2D, the photoresist layer 20 is removed, followed by the deposition of a polysilicon layer 22. At this stage, in some conventional fabricating processes, an ion implantation procedure may be performed on the polysilicon layer 22 to form lightly-doped implantation regions. In other prior art processes, an ion implantation procedure is not performed.

Then, as shown in FIG. 2E, on the surface of the polysilicon layer 22, another photoresist layer 24 is formed, the photoresist layer having openings exposing the surface of portions of the polysilicon layer required to be removed, including the portions between the source/drain region 14 and the gate 12. Then, as shown in FIG. 2F, these exposed portions of the polysilicon layer 22 are removed by etching, resulting in an open circuit between the source/drain region 14 and the gate 12. Then, as shown in FIG. 2G, the photoresist layer 24 is removed.

Next, as is shown in FIG. 2H, still another photoresist layer 26 is formed on the surface of the device substrate. The patterning in this photoresist layer 26 is intended to inclusively shield those portions of the polysilicon layer 22 designated for the formation of the load resistors. The exposed areas, that is the areas not covered by the photoresist layer 26, are thus those designated to be used as device interconnectors. Thus, as shown in FIG. 2I, a heavy dosage of impurity ions is implanted in those regions not covered by the photoresist layer 26, so that heavily-doped regions are formed in those interconnectors in the polysilicon layer 22, resulting in a reduction of the interconnector resistance. Interconnectors so formed include a $V_{CC}$ conductor 28, a drain conductor 30, and a gate conductor 32.

Finally, as shown in FIG. 2J, the photoresist layer 26 is removed. The newly exposed lightly-doped or undoped regions are now load resistors 34 for the fabricated SRAM memory cell unit.

As indicated, this described prior art process of fabricating of the load resistors for SRAM memory cell units employs the same single polysilicon layer to fabricate both its load resistors and its interconnectors. Those portions of the single polysilicon layer formed into the load resistors are either lightly-doped or undoped regions, while the portions formed into the interconnectors are heavily-doped regions.

A major drawback of such a prior art process for the fabrication of SRAM memory cell units is that during the subsequent thermal fabricating procedural steps after the formation of the load resistors and the interconnectors for the memory cell unit, implanted ion impurities in the high dosage regions of the interconnectors would inevitably diffuse into the lightly-doped or undoped regions of the load resistors. This essentially reduces the resistance in the load resistors as the effective lengths of the load resistors are reduced. The direct result of this load resistance reduction is an increase in the memory cell current, and a consequent increase in device power consumption.

Meanwhile, since the thickness in the load resistor regions is substantially the same as that in the interconnectors, it is difficult to increase the resistance in the load resistors by having the thickness of the load resistors reduced, without also reducing the thickness of the interconnectors. This is because the thickness of the interconnectors would also be adversely affected, and the resistance of the interconnectors would be undesirably increased. The direct result of such a reduction in thickness would be a deterioration of interconnector conductivity.

SUMMARY OF THE INVENTION

It is therefore an object of the invention to provide a process for fabricating high-resistance load resistors utilizing dummy polysilicon, in four-transistor SRAM devices.

It is another object of the invention to provide a process for fabricating high-resistance load resistors for SRAM memory cell units, having elongated load resistor effective lengths.

It is still another object of the invention to provide a process for fabricating high-resistance load resistors for SRAM memory cell units, that can prevent implanted impurity ions in the interconnectors from diffusing into the load resistors, which would cause an undesirable reduction of resistance in the load resistors.

To achieve the above-identified objects, the invention provides a process for fabricating load resistors for memory cell units of semiconductor SRAM devices. The process includes the following steps: First, a silicon substrate containing an intermediate semiconductor device, including the gate structure and source/drain regions for the transistor element of the cell unit, is provided. A first dielectric layer is then formed over the surface of the silicon substrate. The first dielectric layer has a via exposing the gate electrode of the gate structure. A polysilicon layer is then deposited over the substrate. The polysilicon layer is patterned for forming a first connector in the vias provided in the first dielectric layer, at least one dummy structure on the first dielectric layer, and a second connector. A second dielectric structure is then formed with two vias respectively exposing the first and second connectors. A polysilicon load resistor is then formed and coupled electrically to the first and second connectors, so as to extend over the surface of the at least one dummy structure for elongating the length thereof.

BRIEF DESCRIPTION OF THE DRAWINGS

The invention is described below by way of a preferred embodiment, with reference to the drawings in which.

DETAILED DESCRIPTION OF THE PREFERRED EMBODIMENT

Figure 1:
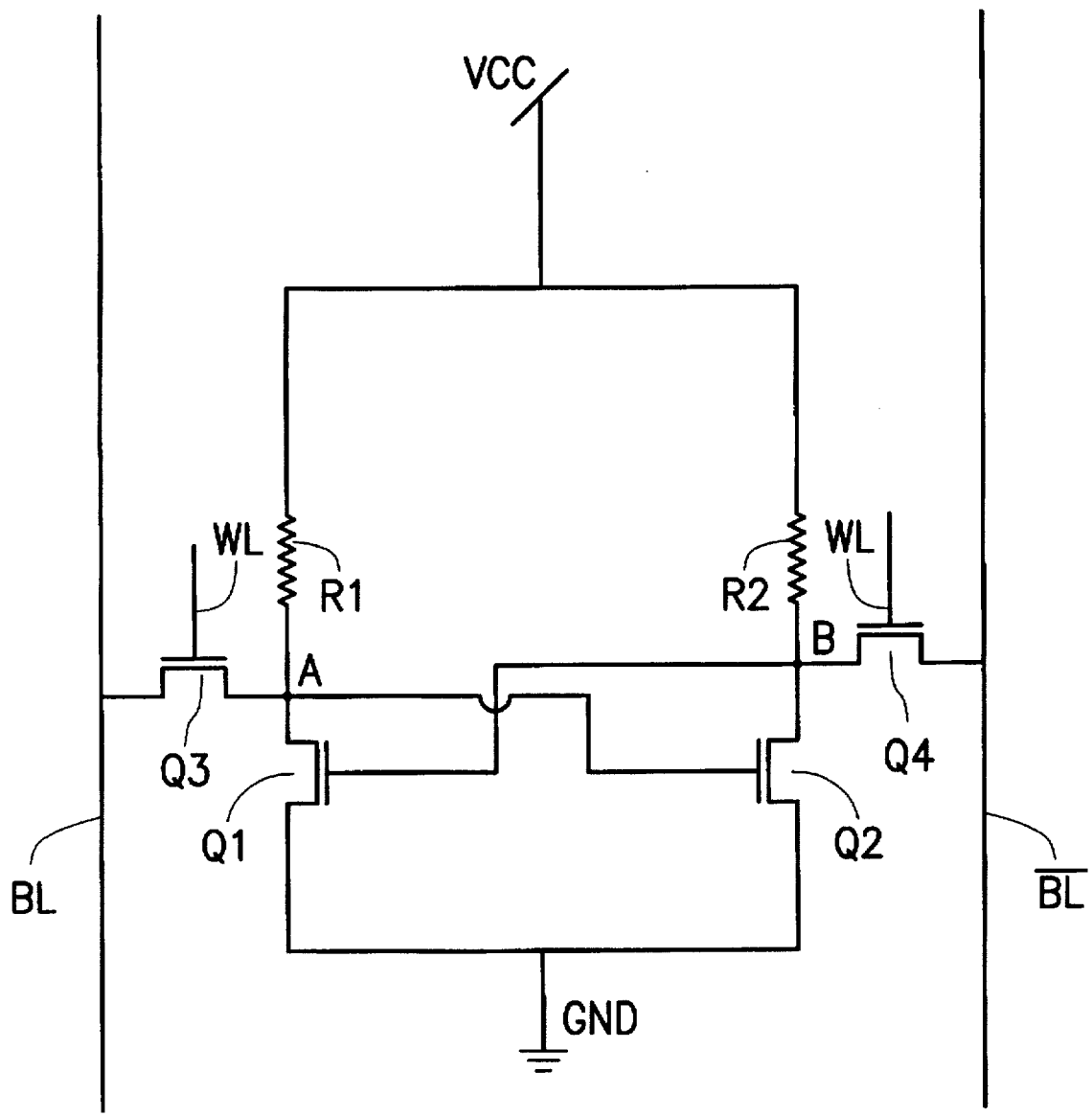
FIG. 1 is a schematic diagram showing the circuitry of an SRAM memory cell.
Figure 2A:
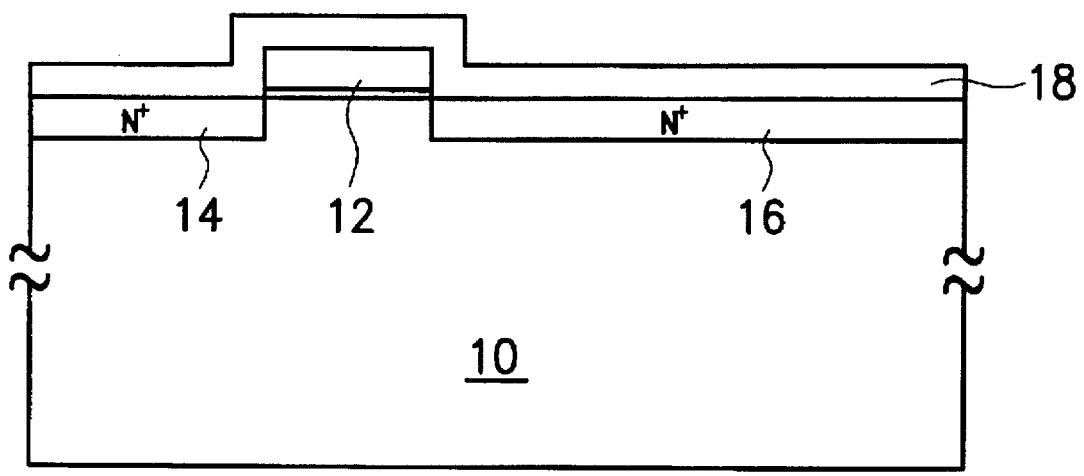
FIGS. 2A–2J are cross-sectional views respectively showing successive stages during the fabrication of the load resistors of a conventional SRAM device.
Figure 2B:
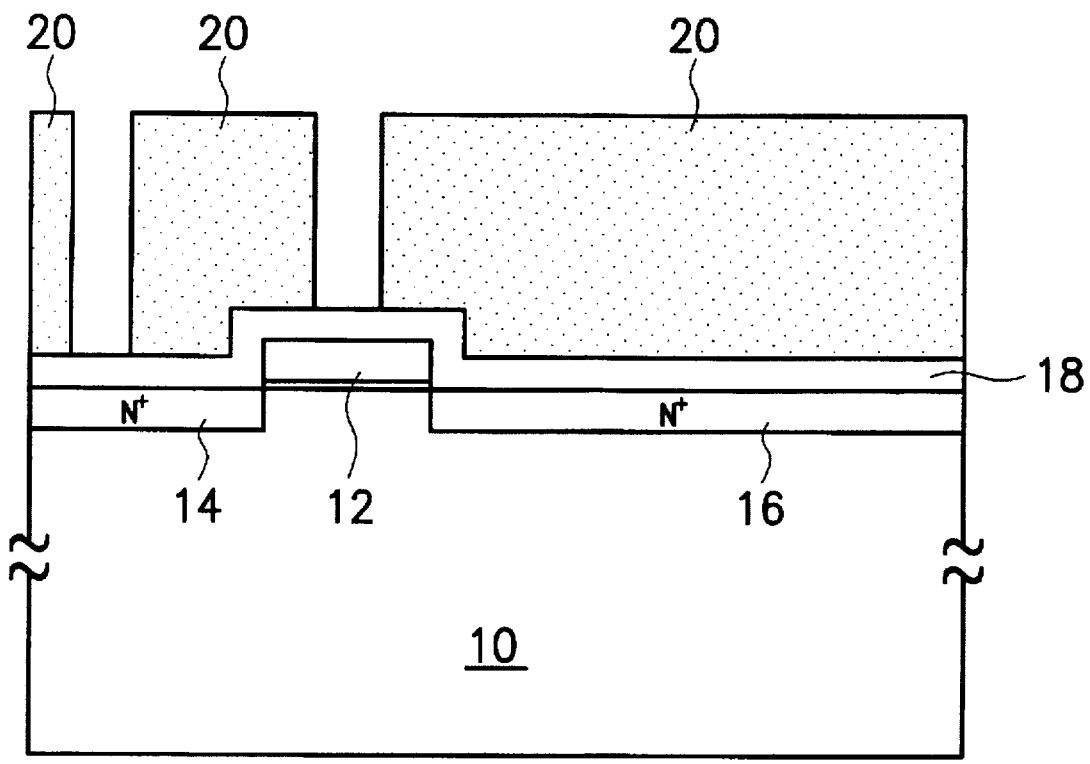
Figure 2C:
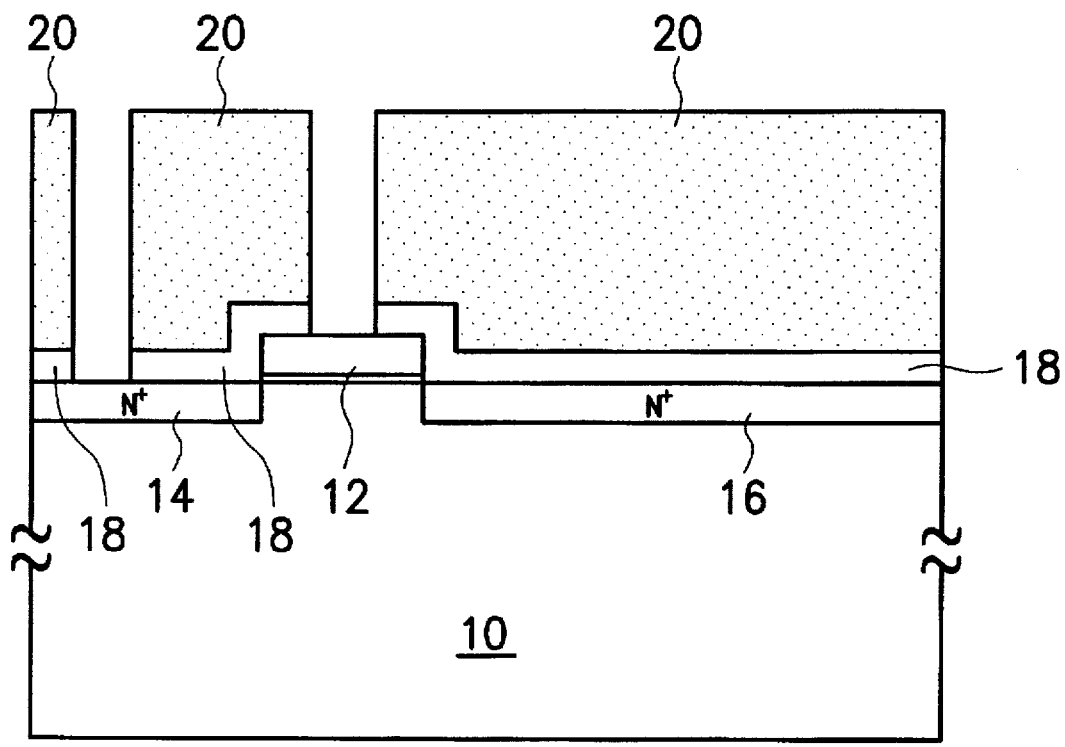
Figure 2D:
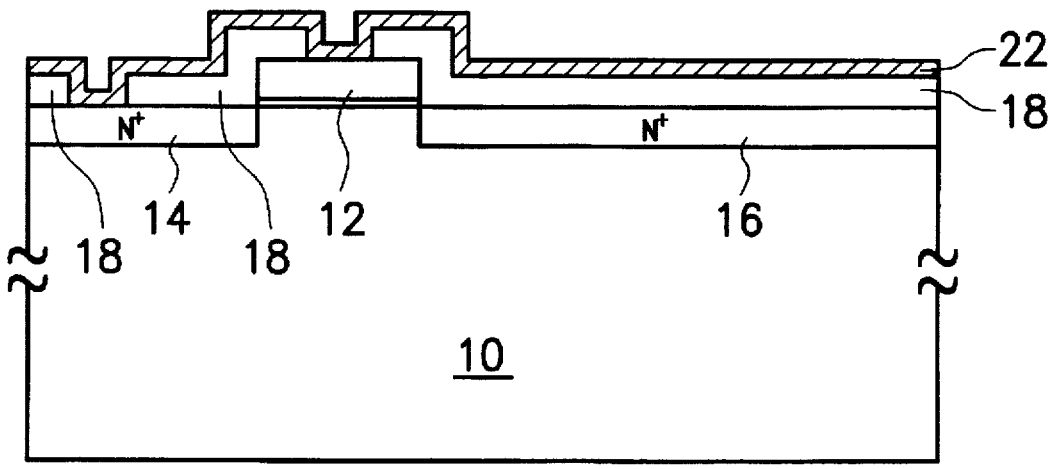
Figure 2E:
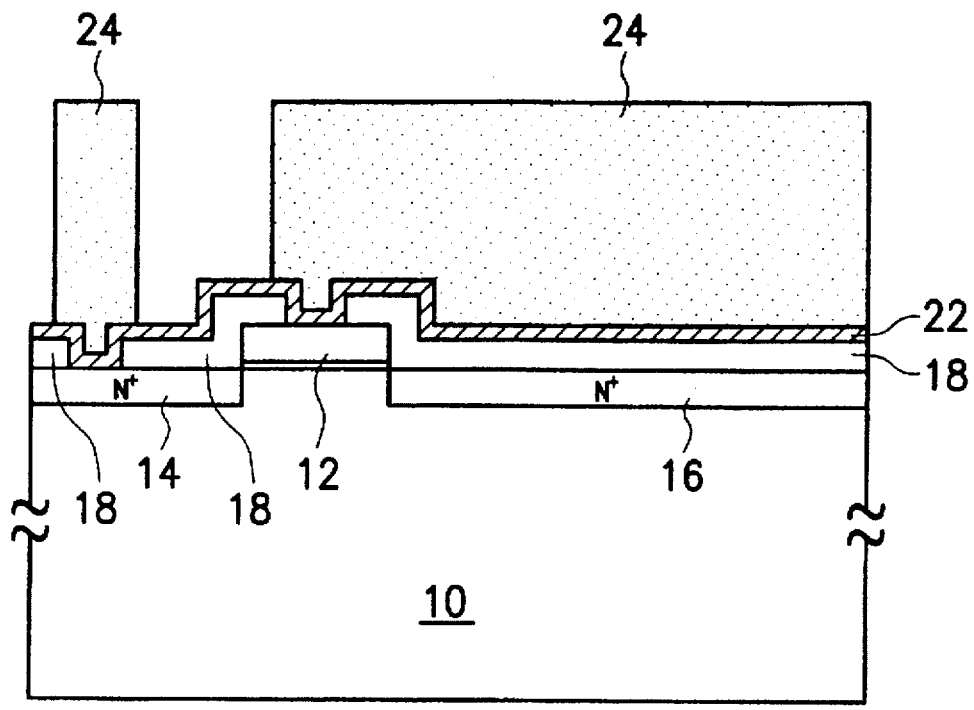
Figure 2F:
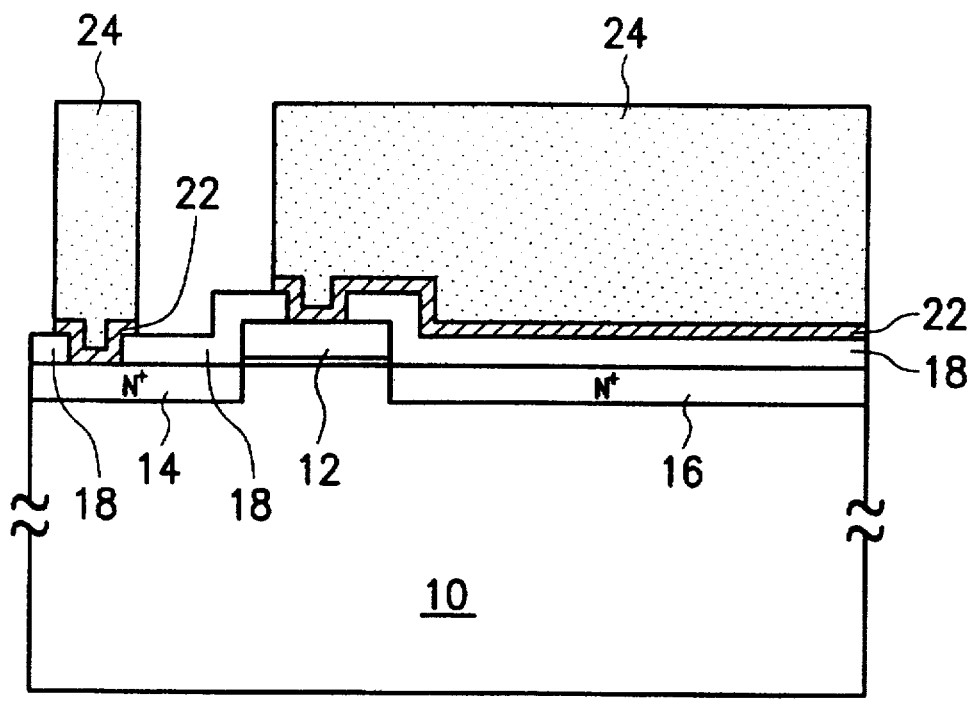
Figure 2G:
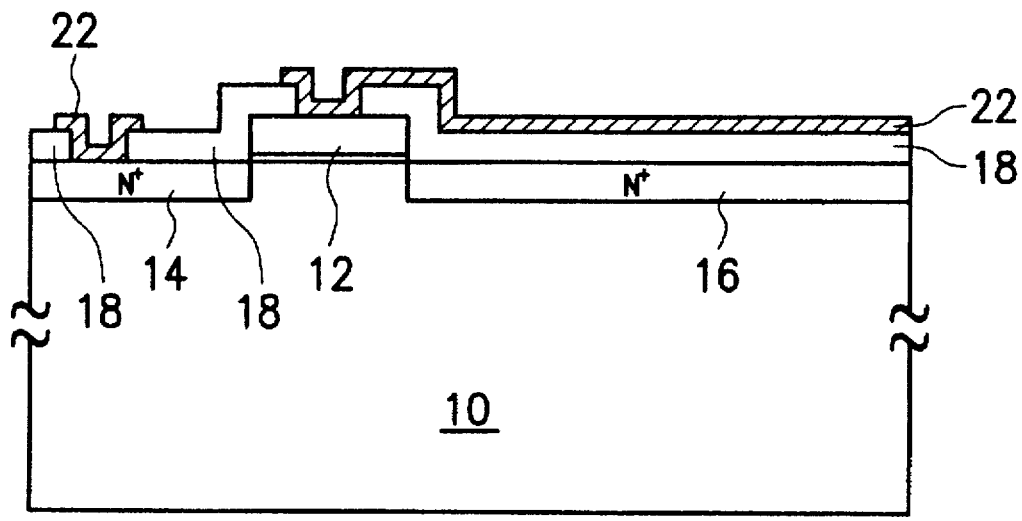
Figure 2H:
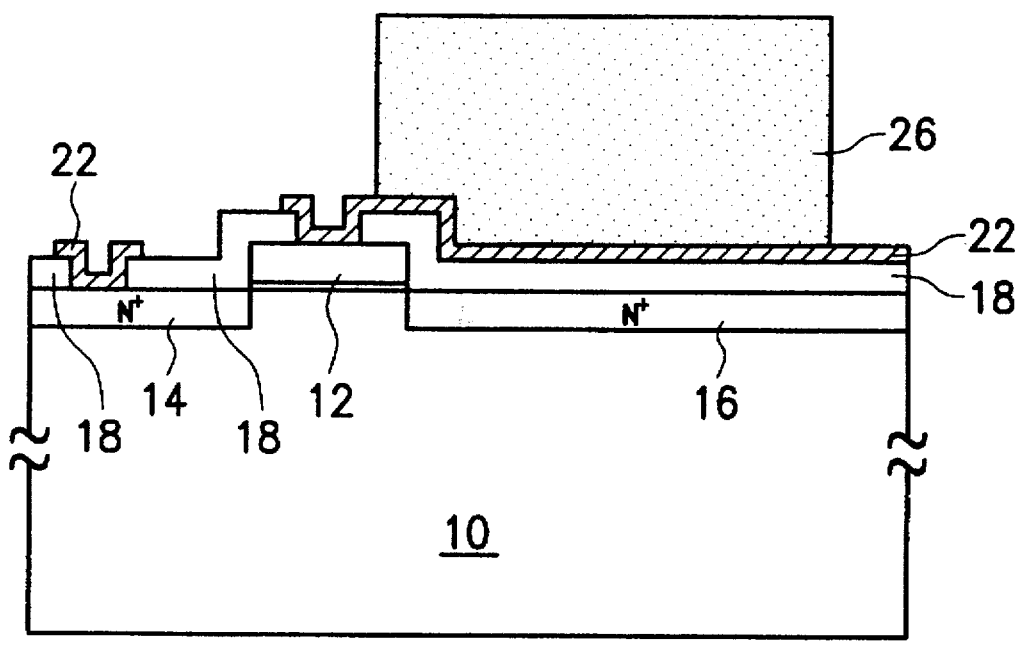
Figure 2I:
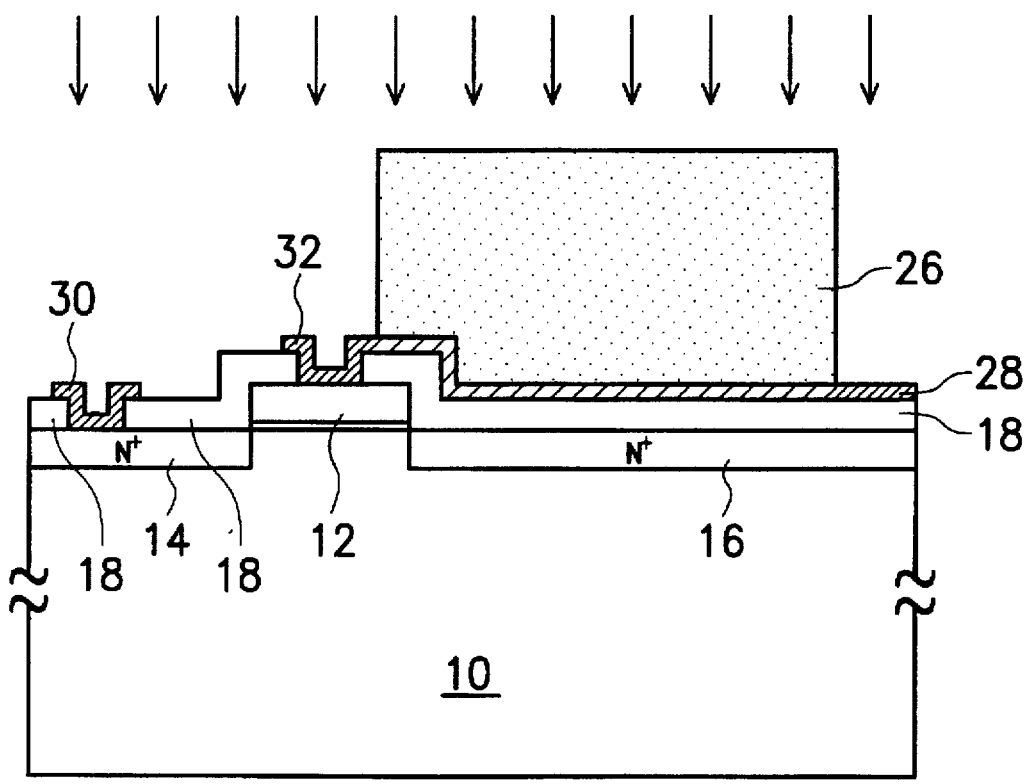
Figure 2J:
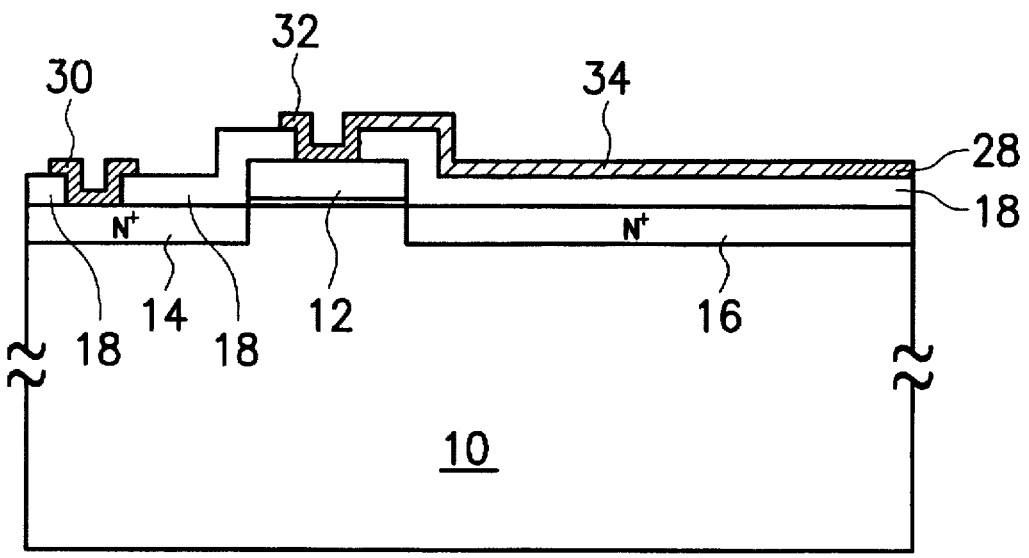
Figure 3A:
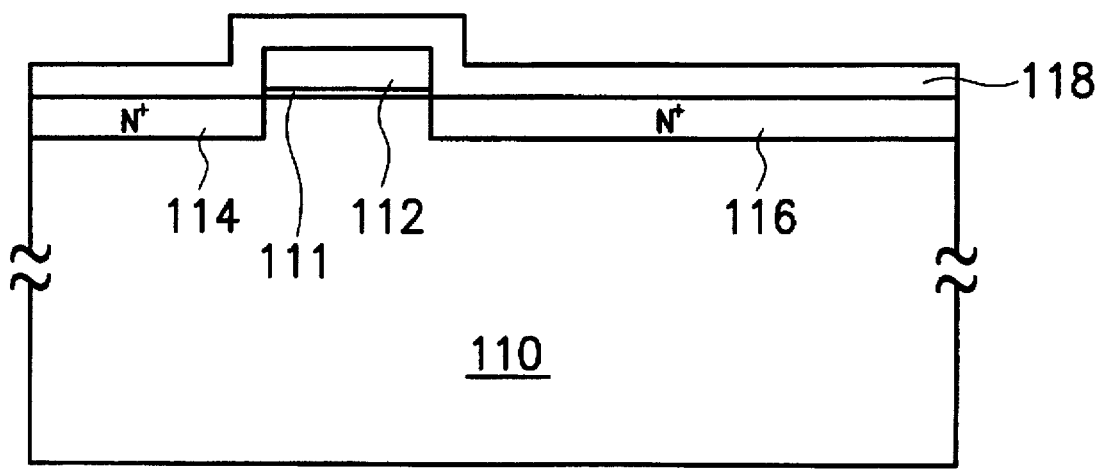
FIGS. 3A–3Q are cross-sectional views respectively of successive stages of fabrication of load resistors of an SRAM device, in accordance with a preferred embodiment of the invention.
Figure 3B:
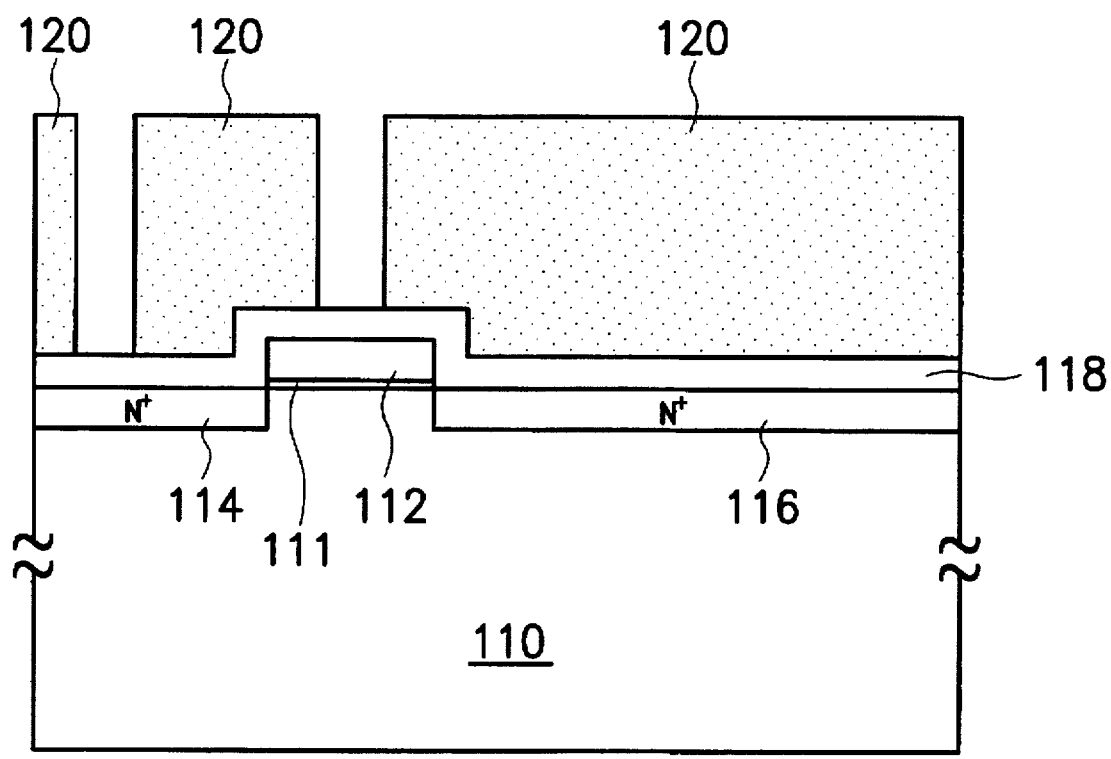
Figure 3C:
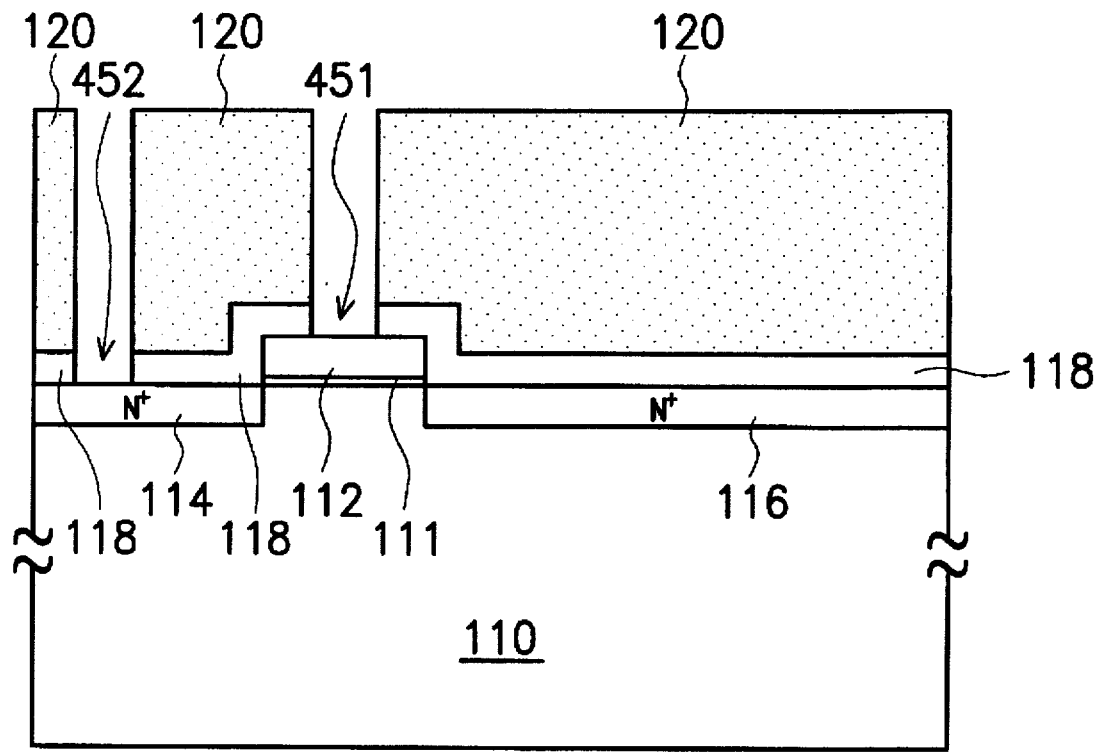
Figure 3D:
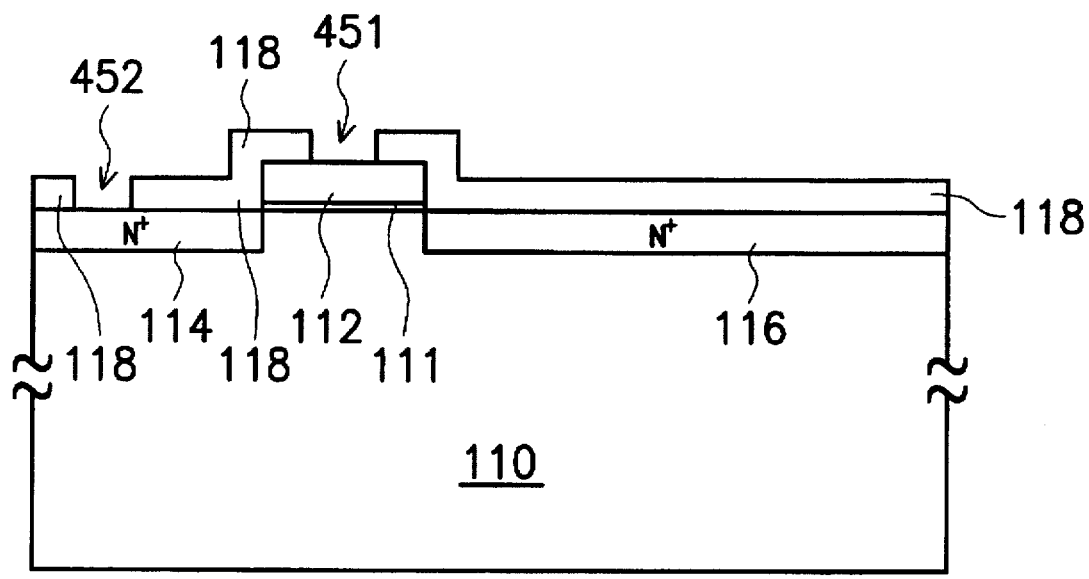
Figure 3E:
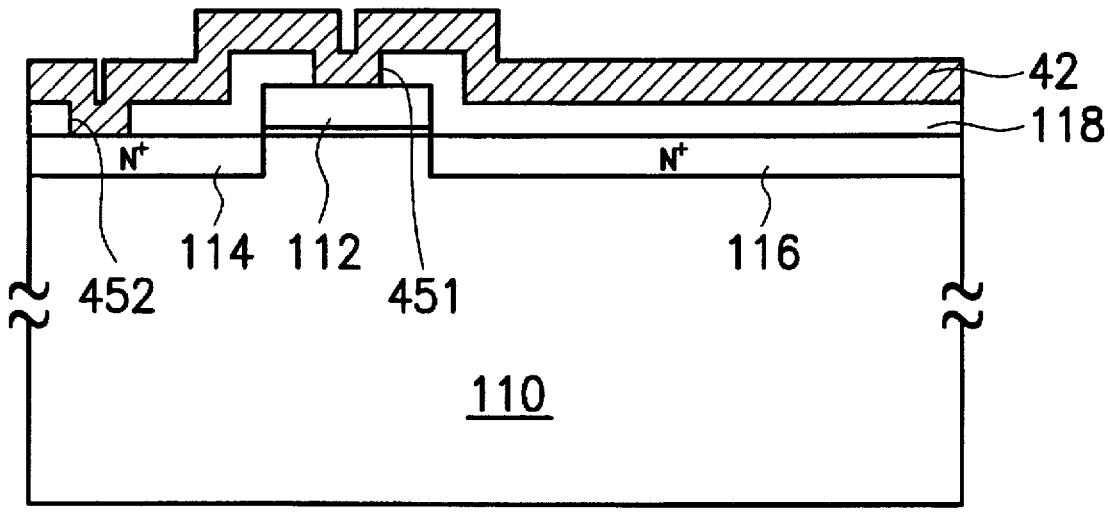
Figure 3F:
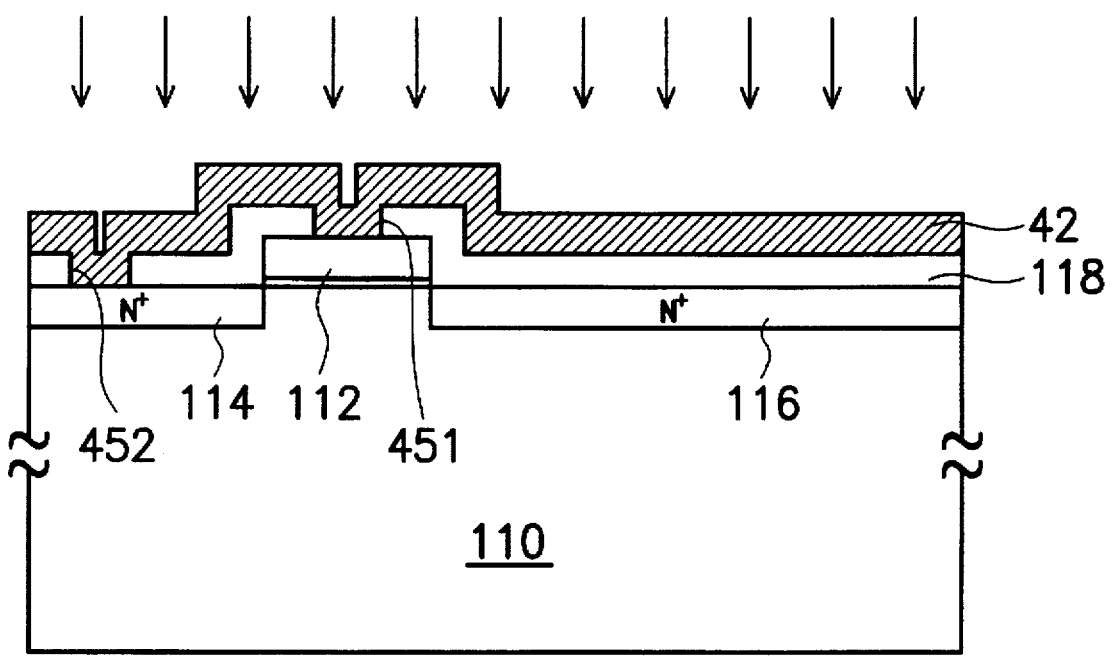
Figure 3G:
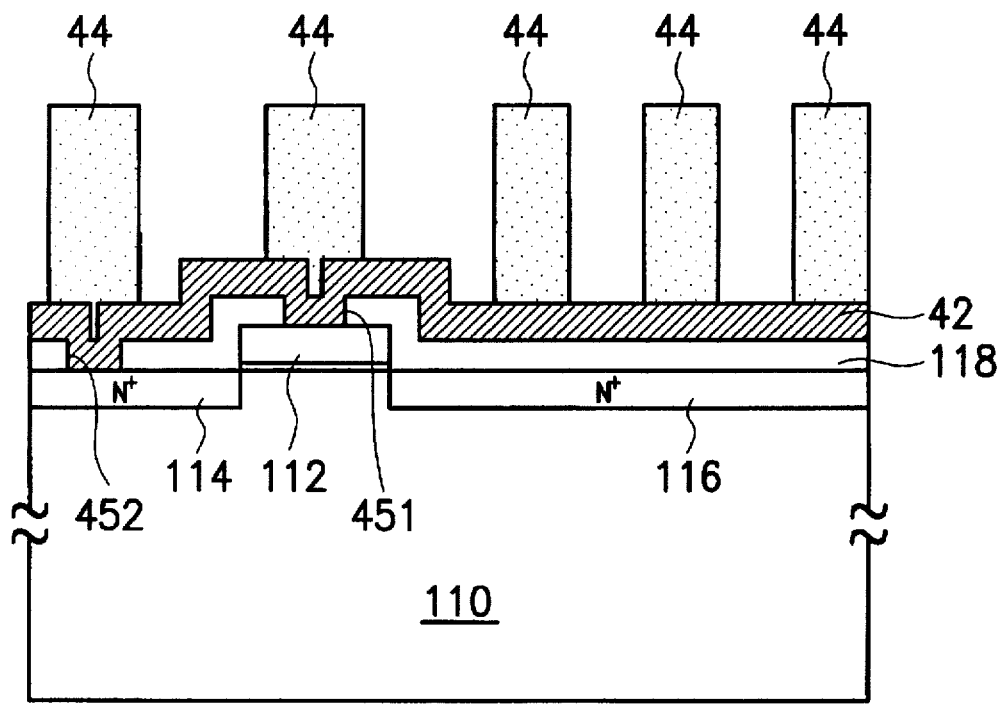
Figure 3H:
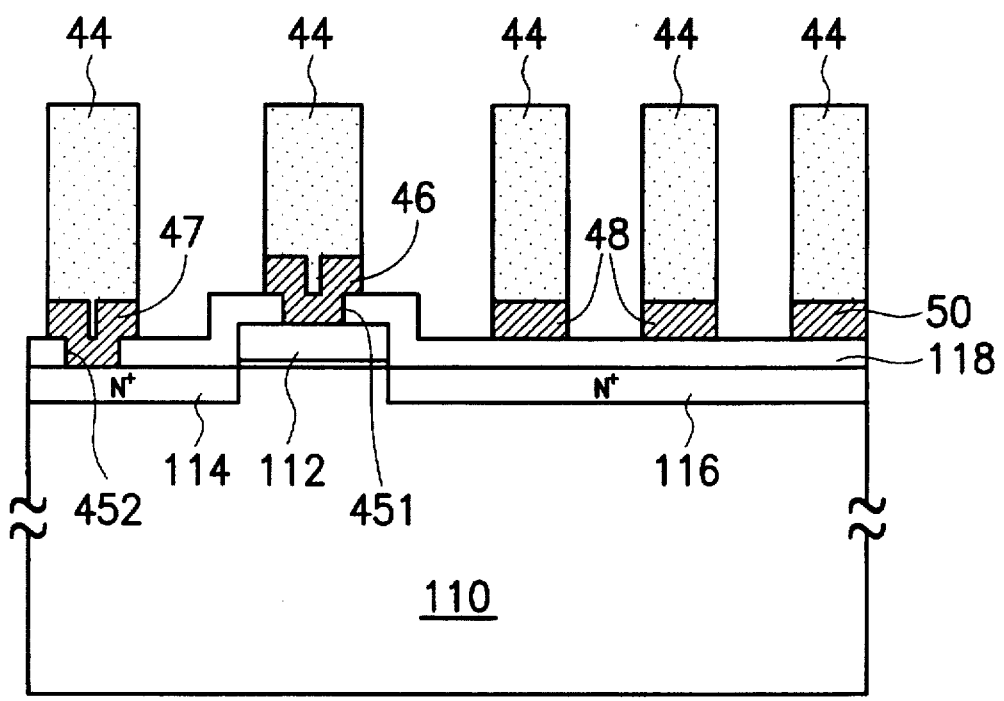
Figure 3I:
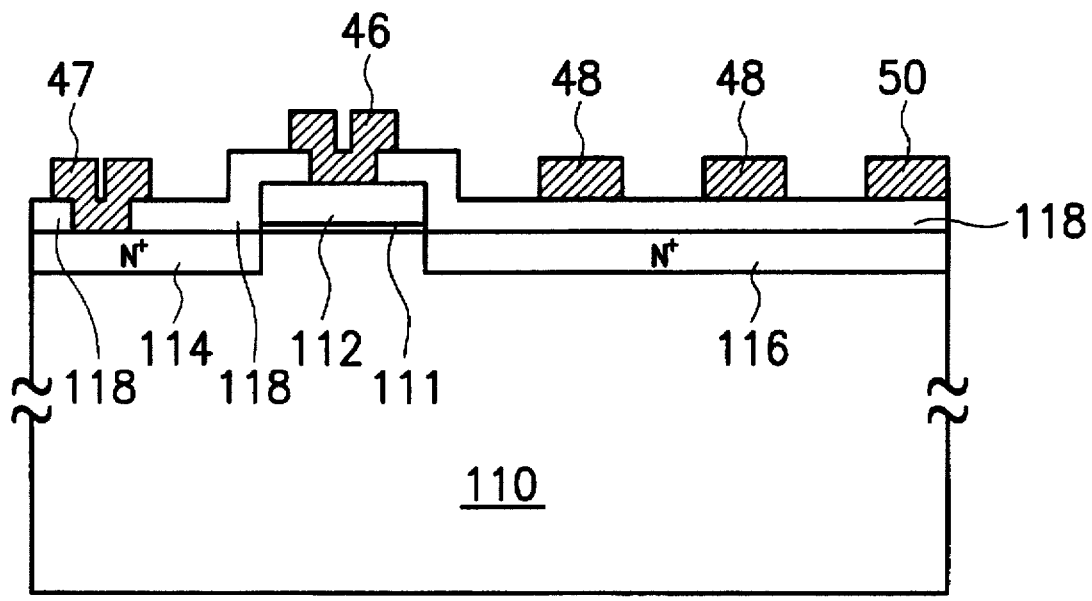
Figure 3J:
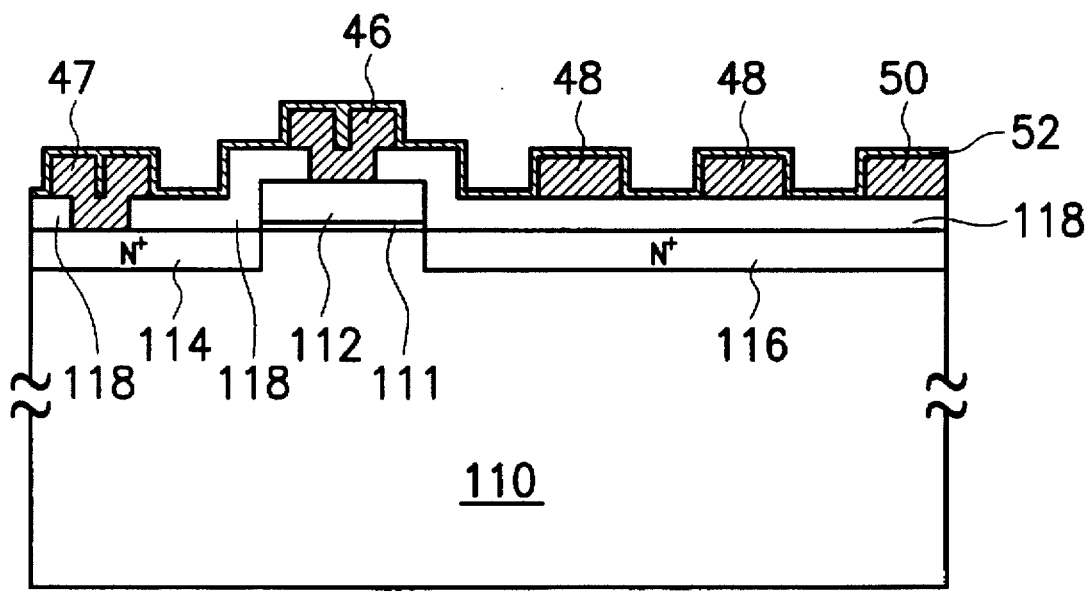
Figure 3K:
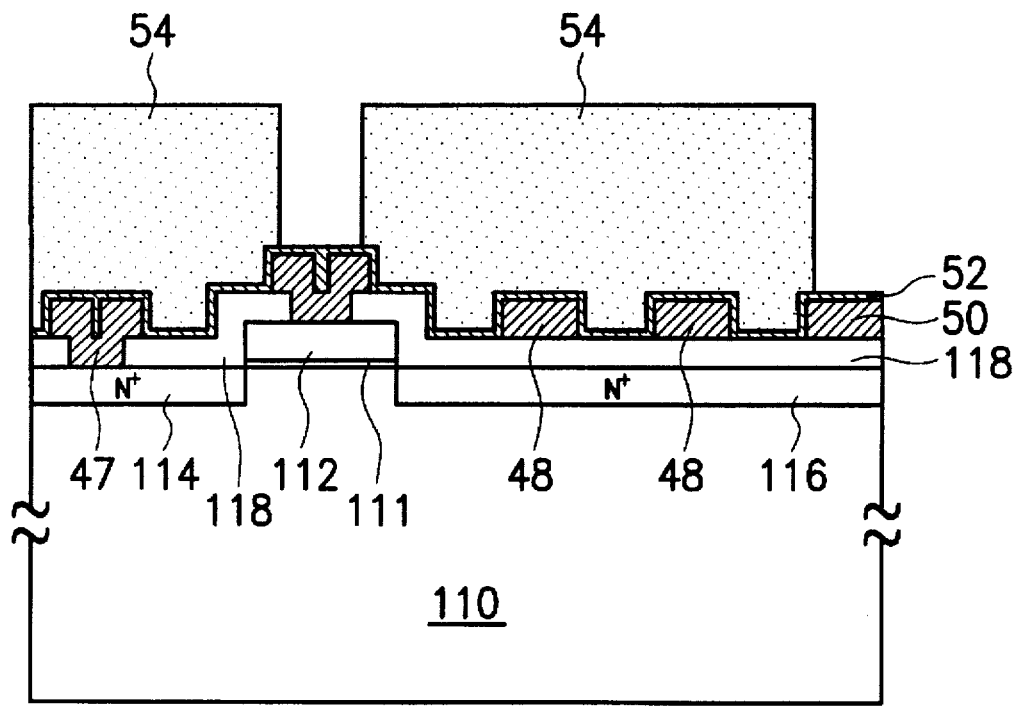
Figure 3L:
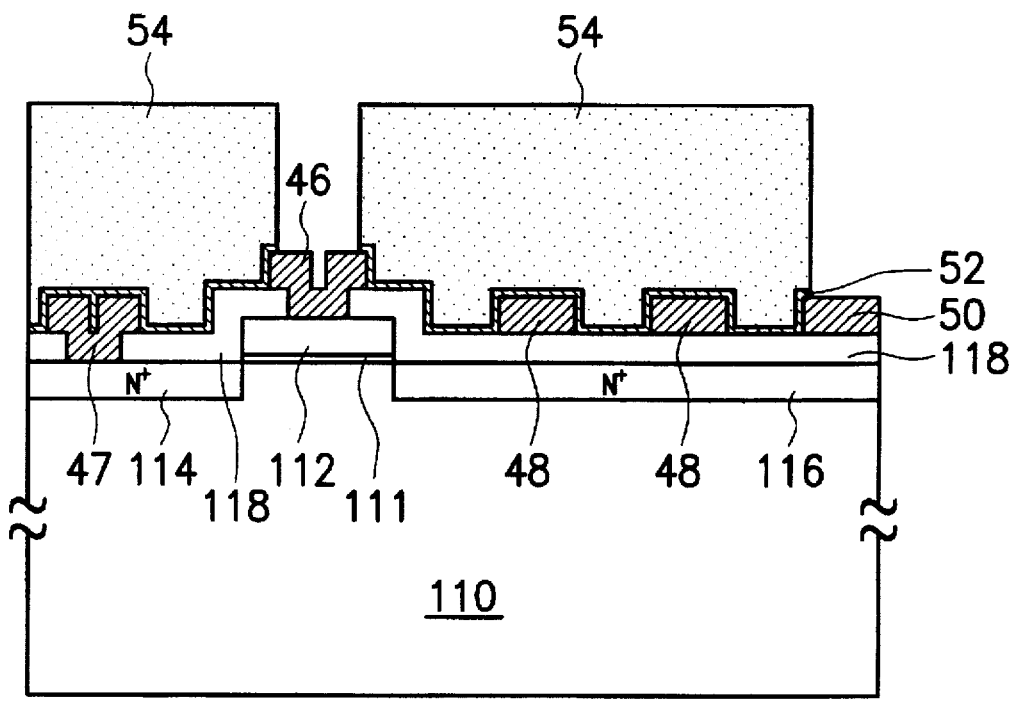
Figure 3M:
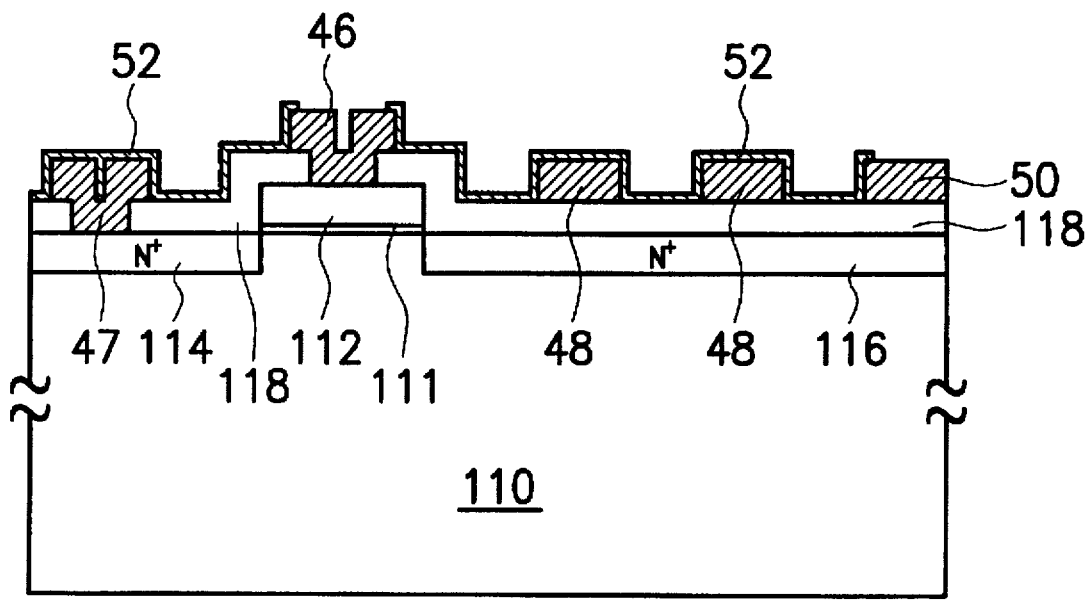
Figure 3N:
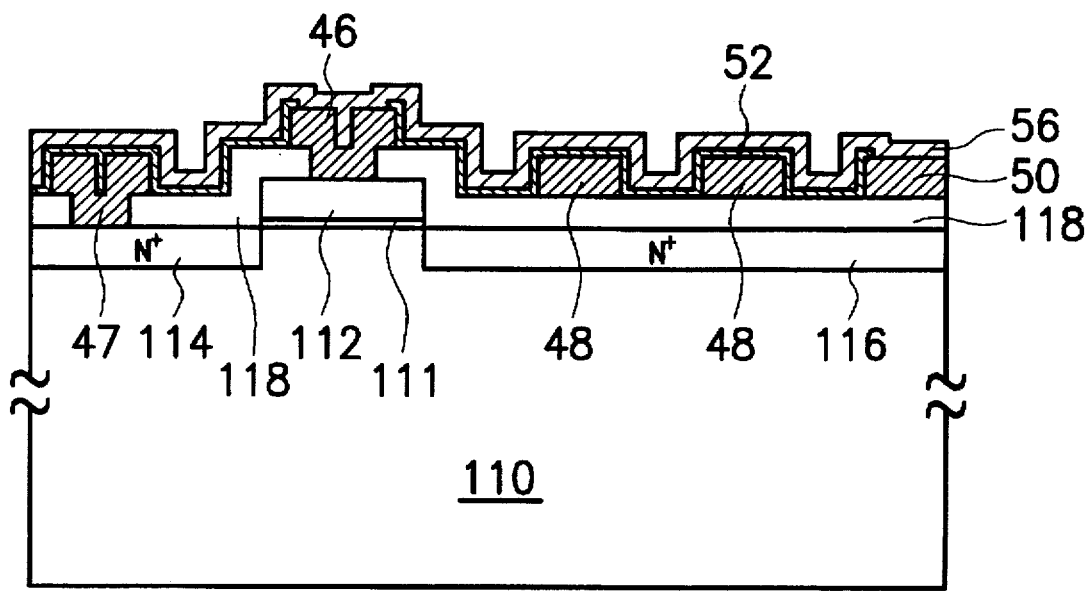
Figure 3O:
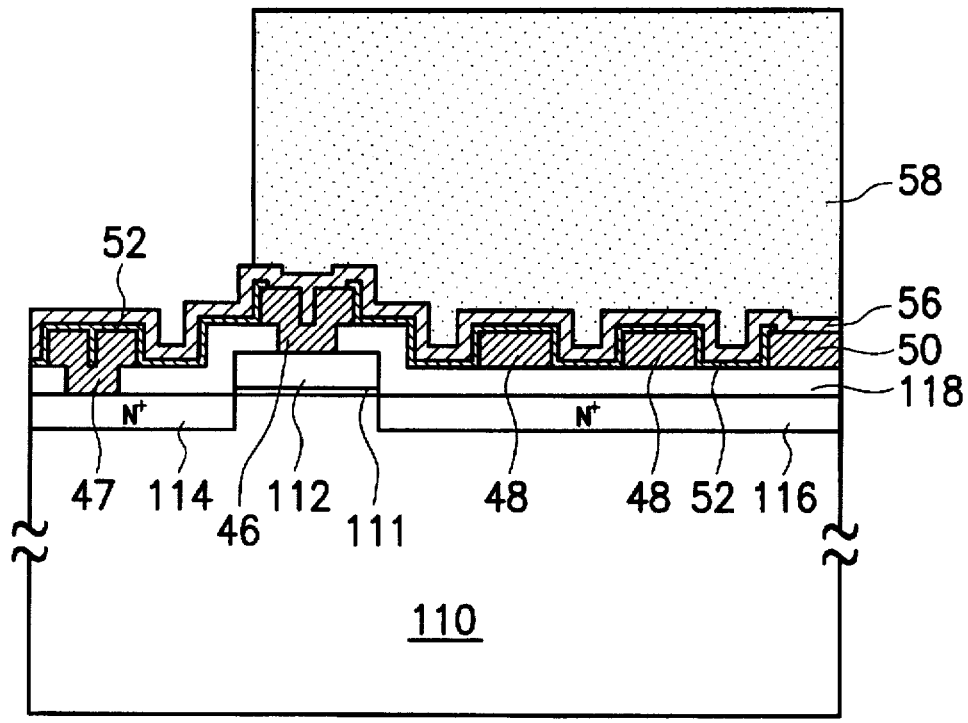
Figure 3P:
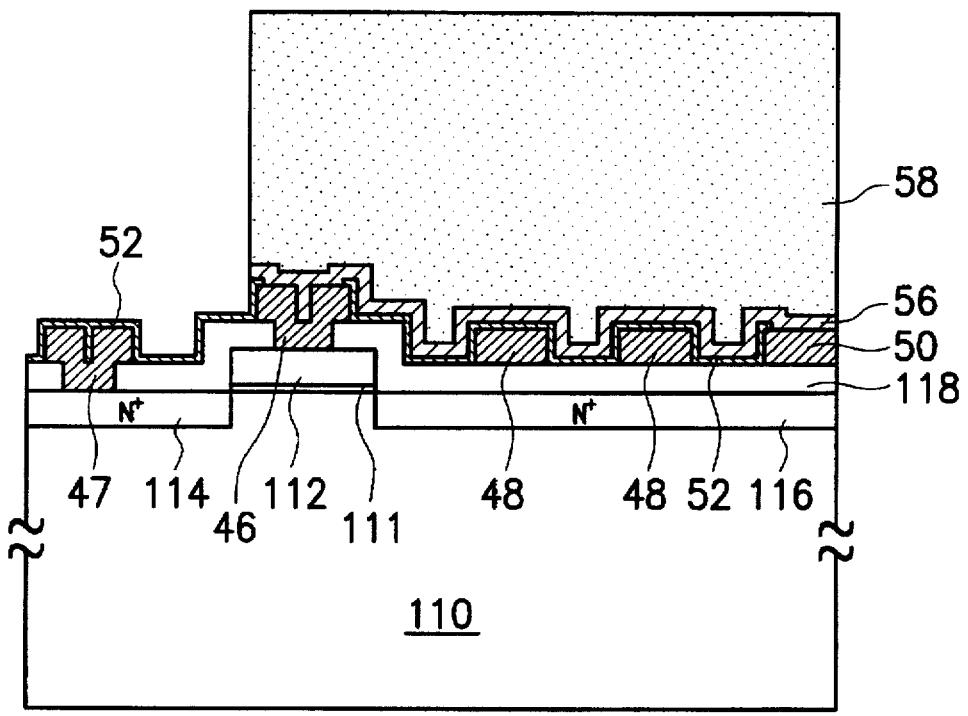
Figure 3Q:
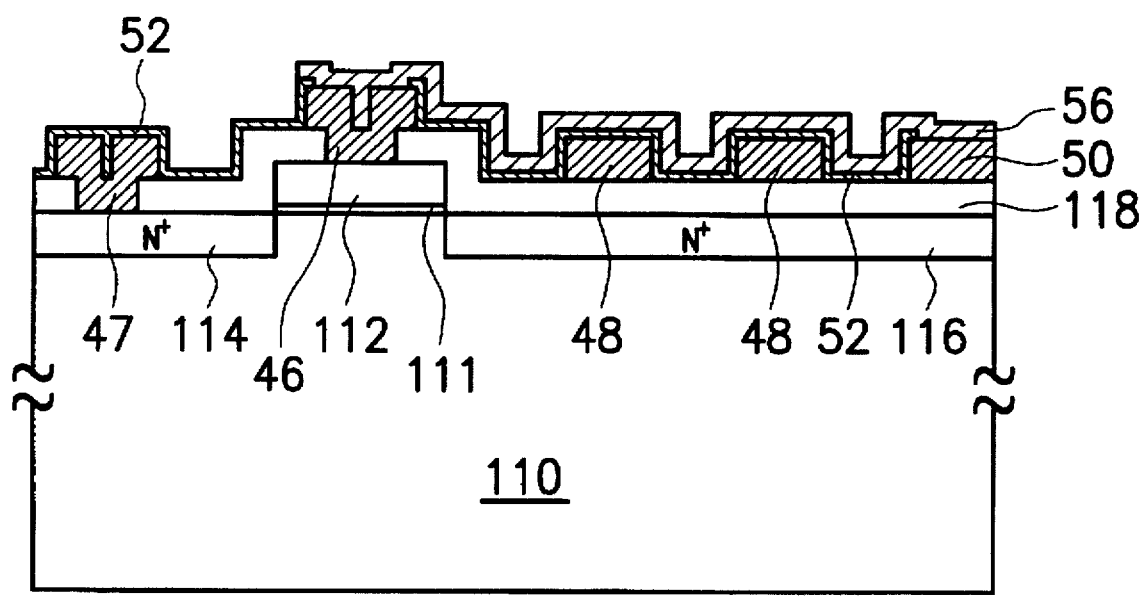

In accordance with the preferred embodiment of the invention, a process is provided for fabricating high-resistance load resistors utilizing dummy polysilicon in four-transistor SRAM devices, is illustrated in FIGS. 3A–3Q.

First, as is shown as shown in FIG. 3A, an intermediate semiconductor device, complete with gate structure and source/drain regions of a transistor for the SRAM memory cell unit, is provided on the surface of a silicon substrate 110, which in the described embodiment is a P-type substrate. The gate structure of the transistor includes a gate electrode 112. A gate dielectric layer 111 directly underneath the gate electrode 112 is layered above the substrate 110. The gate dielectric layer 111 has a thickness of about 70 to 300 Å, and may be formed, for example, by thermal oxidation.

Afterwards, the gate electrode 112 may be formed by, for example, a chemical vapor deposition (CVD) procedure in which a polysilicon layer that is doped heavily and has a thickness of about 1,500 to 4,500 Å, is deposited on the gate dielectric layer 111. The source/drain regions 114 and 116 are N+ regions, which are formed utilizing conventional methods. An interpolysilicon dielectric layer 118 is then formed to cover the surface of the device substrate at this stage. This inter-polysilicon dielectric layer 118 may be formed by, for example, a CVD procedure by depositing silicon oxide to a thickness of about 500 to 3,000 Å.

Next, referring to FIG. 3B, a photolithography procedure is performed in which a photoresist layer 120 is formed over the surface of the dielectric layer 118 and then is patterned to expose those portions of the dielectric layer 118 intended to be removed.

Then, as shown in FIG. 3C, exposed portions of the dielectric layer 118, not covered by the photoresist layer 120, are removed by an anisotropic etching procedure. This forms vias 451 and 452 in the dielectric layer 118 that facilitate a connection between the gate electrode 112 and the N+ source/drain region 114. The anisotropic etching may be implemented using an etchant gas, such as $CHF_3/CF_4$. At the conclusion of this etching procedure, the photoresist layer 120 may be removed, as shown in FIG. 3D.

Next, referring to FIG. 3E, a layer of polysilicon 42 is formed so as to cover the surface of the device substrate. The polysilicon layer 42 may be formed by, for example, a CVD procedure that deposits the polysilicon to a thickness of about 300 to 5,000 Å. Then, as is illustrated in FIG. 3F, an ion implantation procedure may be performed to reduce the resistance of the polysilicon layer 42, by implanting therein impurities such as ions of arsenic, phosphorus, $BF_2$ or boron. The ions may be implanted at an energy level of about 5 to 80 KeV, to achieve an impurity dosage of about $1 \times 10^{15}$ to $8 \times 10^{15}$ ions/cm$^2$.

Then, referring to FIG. 3G, a photolithography procedure is performed, first to form a patterned photoresist layer 44 that reveals those portions of the polysilicon layer 42 required to be removed, and then, as is shown in FIG. 3H, to anisotropically etch away those exposed portions. This forms a gate electrode connector 46 in the via 451, and a source/drain connector 47 in the via 452. Also, so formed are several components referred to herein as dummies 48 and a $V_{CC}$ power connector 50. Among these, connectors 46, 47 and 50 are used as the interconnectors for the fabricated SRAM memory cell unit. The anisotropic etching of this photolithography procedure may be performed using, for example, an $HBr/Cl_2/O_2$ etchant gas.

Then, as is shown in FIG. 3I, the photoresist layer 44 is removed, and as shown in FIG. 3J, a second dielectric layer 52 is formed, for example, of a silicon nitride ($Si_3N_4$) layer having a thickness of about 200 to 2,000 Åby, for example, a CVD procedure. Alternatively, the second dielectric layer 52 may be formed of silicon dioxide.

Next, as is shown in FIG. 3K, a second photolithography procedure is performed to first form a photoresist layer 54 over the surface of the second dielectric layer 52. The patterning of the photoresist layer 54 reveals the portions of the dielectric layer 52 to be removed. Referring to FIG. 3L, the etching phase of this second photolithography procedure removes those exposed portions of the second dielectric layer 52, until the gate electrode connector 46 and $V_{CC}$ connector 50 are exposed. The etchant gas employed for this anisotropic etching procedure may be, for example, $CF_4/O_2$ or $C_2F_6$. Afterwards, the photoresist layer 54 is removed, as is shown in FIG. 3M.

Then, referring to FIG. 3N, still another polysilicon layer 56 is formed to a thickness of about 300 to 3,000 Å by, for example, a CVD procedure. Then, as shown in FIG. 3O, yet another photolithography procedure is performed to first provide a photoresist layer 58 that is patterned to reveal the portions of the polysilicon layer 56 to be removed. Referring to FIG. 3P, an anisotropic etching phase of the photolithography procedure is then performed to etch away such portions of the polysilicon layer. The etchant gas for this procedure may be, for example, $HBr/Cl_2/O_2$.

Finally, as shown in FIG. 3Q, the photoresist layer 58 is removed to reveal the remaining portions of the polysilicon layer 56 that constitute a load resistor of the fabricated SRAM memory cell unit. This load resistor is electrically coupled to the gate electrode connector 46 and the $V_{CC}$ connector 50, and also extends over the dummies 48 for increased length. The formation of the load resistor for the memory cell unit is thereby substantially concluded.

In accordance with the above-described embodiment for the fabrication of the load resistors for the SRAM device memory cell units of the invention, the interconnectors in the cell units are formed by etching into the second polysilicon layer 42 that has been implanted with impurity ions. On the other hand, the load resistor is formed in the third polysilicon layer 56 so as to extend over the dummies formed in the second polysilicon layer and thereby exhibits increased resistance due to its increased overall length. Such an increase in resistance does not affect the resistance of the interconnectors. Further, since the interconnectors and the load resistor are formed in separate polysilicon layers, the thicknesses thereof can be adjusted independently. This allows for the use of a relatively thicker layer for the interconnectors and a relatively thinner layer for load resistor.

While the invention has been described by way of example and in terms of a preferred embodiment, it is to be understood that the invention is not limited to the disclosed embodiment. For example, although the described embodiment employs a P-type substrate, the invention is equally applicable to a process performed on an N-type substrate. In that case, as persons skilled in the art may well appreciate, N+ regions in the embodied P-type substrate would be replaced by P-wells. Thus, the invention is intended to cover various modifications and similar arrangements, and the scope of appended claims should be accorded the broadest interpretation so as to encompass all such modifications and similar arrangements.

What is claimed is:

1. A process for fabricating a load resistor for a memory cell unit of a static random-access memory device, comprising the steps of:

(a) providing a silicon substrate containing an intermediate semiconductor device, including a gate structure and source/drain regions for a transistor of the memory cell unit;

(b) forming a first dielectric layer over the silicon substrate, the first dielectric layer having a gate via exposing a gate electrode of the gate structure;

(c) depositing a polysilicon layer over the silicon substrate;

(d) patterning the polysilicon layer to form a first connector in the gate via, at least one dummy structure on the first dielectric layer, and a second connector;

(e) forming a second dielectric layer having first and second vias respectively exposing the first and second connectors; and (f) forming the polysilicon load resistor, electrically coupled to the first and second connectors, and extending over the at least one dummy structure to elongate a length of the load resistor.

2. The process of claim 1, wherein the polysilicon layer has a thickness in a range of about 300 to 5,000 Å.

3. The process of claim 1, further comprising the step of diffusing impurities into the polysilicon layer, so as to reduce resistance of the polysilicon layer.

4. The process of claim 1, wherein the second dielectric layer is a silicon nitride layer.

5. The process of claim 1, wherein the second dielectric layer is a silicon dioxide layer.

6. The process of claim 1, wherein the polysilicon load resistor has a thickness in a range of about 300 to 3,000 Å.

7. The process of claim 1, wherein said step (d) includes the step of anisotropically etching the polysilicon layer to form the first and second connectors and the at least one dummy structure.

* * * * *